United States Patent
Shibata et al.

(10) Patent No.: US 7,493,423 B2
(45) Date of Patent: Feb. 17, 2009

(54) DATA TRANSFER CONTROL DEVICE AND ELECTRONIC INSTRUMENT

(75) Inventors: Yukinari Shibata, Sapporo (JP); Tomonaga Hasegawa, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 401 days.

(21) Appl. No.: 11/073,853

(22) Filed: Mar. 8, 2005

(65) Prior Publication Data
US 2005/0201162 A1 Sep. 15, 2005

(30) Foreign Application Priority Data
Mar. 9, 2004 (JP) ............... 2004-066160

(51) Int. Cl.
G06F 3/00 (2006.01)
G06F 13/14 (2006.01)

(52) U.S. Cl. ........................ 710/21; 710/305
(58) Field of Classification Search .......... 710/21, 710/305
See application file for complete search history.

(56) References Cited

U.S. PATENT DOCUMENTS

| | | | |
|---|---|---|---|
| 6,298,400 B1 * | 10/2001 | Candelore ............. | 710/71 |
| 6,618,383 B1 * | 9/2003 | Tomlins ............... | 370/395.5 |
| 6,782,435 B2 * | 8/2004 | Garcia et al. ......... | 710/33 |
| 6,812,870 B1 * | 11/2004 | Kryzak et al. ........ | 341/95 |
| 6,820,165 B2 * | 11/2004 | Pannell ............... | 710/313 |
| 6,823,468 B2 | 11/2004 | Gredone et al. | |
| 6,823,469 B2 | 11/2004 | Gredone et al. | |
| 6,829,718 B2 | 12/2004 | Gredone et al. | |
| 6,848,018 B2 | 1/2005 | Gredone et al. | |
| 7,058,120 B1 * | 6/2006 | Lu et al. ............. | 375/214 |
| 7,069,464 B2 | 6/2006 | Gredone et al. | |
| 7,107,479 B2 | 9/2006 | Gredone et al. | |
| 7,152,136 B1 * | 12/2006 | Charagulla ........... | 710/315 |
| 7,154,902 B1 * | 12/2006 | Sikdar ............... | 370/412 |
| 7,218,638 B2 * | 5/2007 | Moll ................. | 370/395.4 |

(Continued)

FOREIGN PATENT DOCUMENTS

CN 2547071 Y 4/2003

(Continued)

OTHER PUBLICATIONS

'Creating a Third Generation I/O Interconnect' by Ajay V. Bhatt of Technology and Research Labs, Intel Corporation, 2002.*

(Continued)

*Primary Examiner*—Niketa I Patel
*Assistant Examiner*—Steven G Snyder
(74) *Attorney, Agent, or Firm*—Oliff & Berridge, PLC

(57) ABSTRACT

A data transfer control device including: a node to which is input data to be transferred through serial transfer paths; a LINK circuit which splits the input data into first to pth channels in predetermined units in sequence, and outputs the thus-split data and a split transfer notification for each channel; first to pth parallel/serial conversion circuits which convert the split data and the split transfer notification that are output for each channel into a serial signal; and first to pth transceivers which output the serial signal which has been input from the first to pth parallel/serial conversion circuits to the serial transfer paths for the first to pth channels.

11 Claims, 6 Drawing Sheets

U.S. PATENT DOCUMENTS

| | | |
|---|---|---|
| 7,257,655 B1 * | 8/2007 | Burney et al. ............... 710/105 |
| 2003/0074493 A1 * | 4/2003 | Askar et al. .................... 710/8 |
| 2003/0112798 A1 * | 6/2003 | Ziegler et al. ............... 370/366 |
| 2005/0105370 A1 | 5/2005 | Gredone et al. |
| 2006/0209735 A1 * | 9/2006 | Evoy .......................... 370/315 |

FOREIGN PATENT DOCUMENTS

| | | |
|---|---|---|
| JP | A 3-141757 | 6/1991 |
| JP | A 4-168841 | 6/1992 |
| JP | A 2000-134242 | 5/2000 |
| JP | A 2002-215497 | 8/2002 |
| JP | A 2002-368739 | 12/2002 |

OTHER PUBLICATIONS

'PCI Express Base Specification Revision 1.0a' by PCI-SIG, Apr. 15, 2003.*

'How PCI Express Works' by Tracy V. Wilson, http://computer.howstuffworks.com/pci-express.htm/printable.*

'Understanding PCI Express' by D'Arcy Lemay, http://www.motherboards.org/articles/tech-planations/1438_1.html.*

U.S. Appl. No. 11/073,839, filed Mar. 8, 2005, Shibata et al.

U.S. Appl. No. 11/073,853, filed Mar. 8, 2005, Shibata et al.

* cited by examiner

FIG. 5A
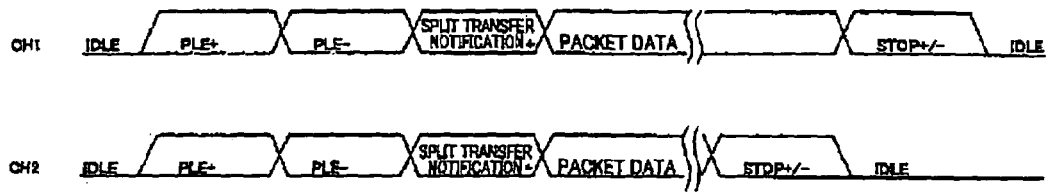
FIG. 5B
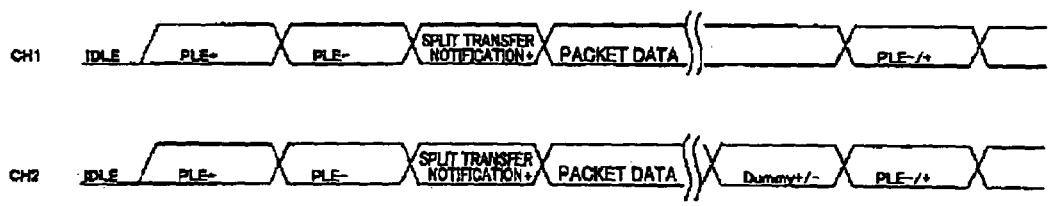
FIG. 5C
| PACKET CONFIGURATION | 7 | 6 | 5 | 4 | 3 | 2 | 1 | 0 |
|---|---|---|---|---|---|---|---|---|
| CH1 | RESPONSE REQUEST | PACKET TYPE | | | LABEL | | | |
| CH2 | RETRY | ADDRESS SIZE | | | STANDARD NO. | | | |
| CH1 | DATA LENGTH ||||||||
| CH2 | DATA LENGTH 1 ||||||||
| CH1 | ADDRESS 0 ||||||||
| CH2 | ADDRESS 1 ||||||||
| CH1 | ||||||||
| CH2 | ADDRESS N ||||||||
| CH1 | ||||||||
| CH2 | WRITE DATA ||||||||
| CH1 | ||||||||
| CH2 | ||||||||
| CH1 | CRC0 ||||||||
| CH2 | CRC1 ||||||||

DATA TRANSFER CONTROL DEVICE AND ELECTRONIC INSTRUMENT

Japanese Patent Application No. 2004-66160, filed on Mar. 9, 2004, is hereby incorporated by reference in its entirety.

BACKGROUND OF THE INVENTION

The present invention relates to a data transfer control device and an electronic instrument.

Various interfaces for high-speed serial transfer have recently attracted much attention as interfaces designed to reduce EMI noise, such as a low voltage differential signaling (LVDS) interface. Such high-speed serial transfer implements data transfer by making a transmitter circuit use differential signals to transmit data that has been made serial and making a receiver circuit perform differential amplification on the differential signals. There are known interfaces for such high-speed serial transfer, such as the digital visual interface (DVI).

With a data transfer control device that implements such high-speed serial transfer, it is desirable that the scale of data transfer is as small as possible. To ensure efficient data transfer in accordance with various different situations, on the other hand, it is desirable to have as many different types of packet for serial transfer.

However, if the number of types of packet for serial transfer increases, the data transfer control device will have to perform complicated processing in order to handle a large number of packets. For that reason, the data transfer control device must have a processor such as a microprocessor unit (MPU) incorporated therein, which increases the size of the data transfer control device.

If the serial transfer path is made multi-channel, information indicating that this is a split transfer can be included in each packet, as shown in FIG. 6C, and such packets can take a configuration in which the packets are split into multiple channels for transmission, as shown in FIG. 6A. However, if channel 1 is delayed more than channel 2 during the sending of the split data, the data that is received through channel 2 is not combined with the data that is received through channel 1 and is thus transmitted at a later stage. In addition, a configuration can be used in which information indicating that the next data to be transferred is part of a split transfer is included beforehand in the packet, as shown in FIG. 6B. However, placing this information relating to the next packet to be transferred into each packet necessitates complicated processing, leading to a deterioration in data transfer efficiency and increasing the scale of the circuit configuration.

SUMMARY

According to a first aspect of the present invention, there is provided a data transfer control device which performs data transfer through serial transfer paths for first to pth channels (where p is a natural number greater than one), the data transfer control device comprising:

a node to which is input data to be transferred through the serial transfer paths;

a logic circuit which splits the input data into the first to pth channels in predetermined units in sequence, and outputs the thus-split data and a split transfer notification for each of the first to pth channels;

first to pth parallel/serial conversion circuits which convert the data and the split transfer notification that are output for the first to pth channels into serial signals; and first to pth output circuits which output the serial signals that have been input from the first to pth parallel/serial conversion circuits to the serial transfer paths for the first to pth channels.

According to a second aspect of the present invention, there is provided a data transfer control device for performing data transfer through serial transfer paths for first to pth channels (where p is a natural number greater than one), the data transfer control device comprising:

first to pth receiver circuits which receives data from the serial transfer paths for the first to pth channels;

first to pth serial/parallel conversion circuits which converts serial signals that have been output from the first to pth receiver circuits into parallel signals;

a split transfer notification code detection circuit which detects whether a split transfer notification code is included in a signal output from the serial/parallel conversion circuits; and a logic circuit which outputs data that has been received from the serial transfer paths for the first to pth channels, in predetermined units in sequence, when the split transfer notification code detection circuit has detected the split transfer notification code.

According to a third aspect of the present invention, there is provided an electronic instrument comprising any of the above-described data transfer control devices.

BRIEF DESCRIPTION OF THE SEVERAL VIEWS OF THE DRAWING

FIGS. 5A and 5B show the signal configuration according to one embodiment of the present invention, and FIG. 5C shows the packet configuration according to one embodiment of the present invention.

DETAILED DESCRIPTION OF THE EMBODIMENTS

Figure 1:
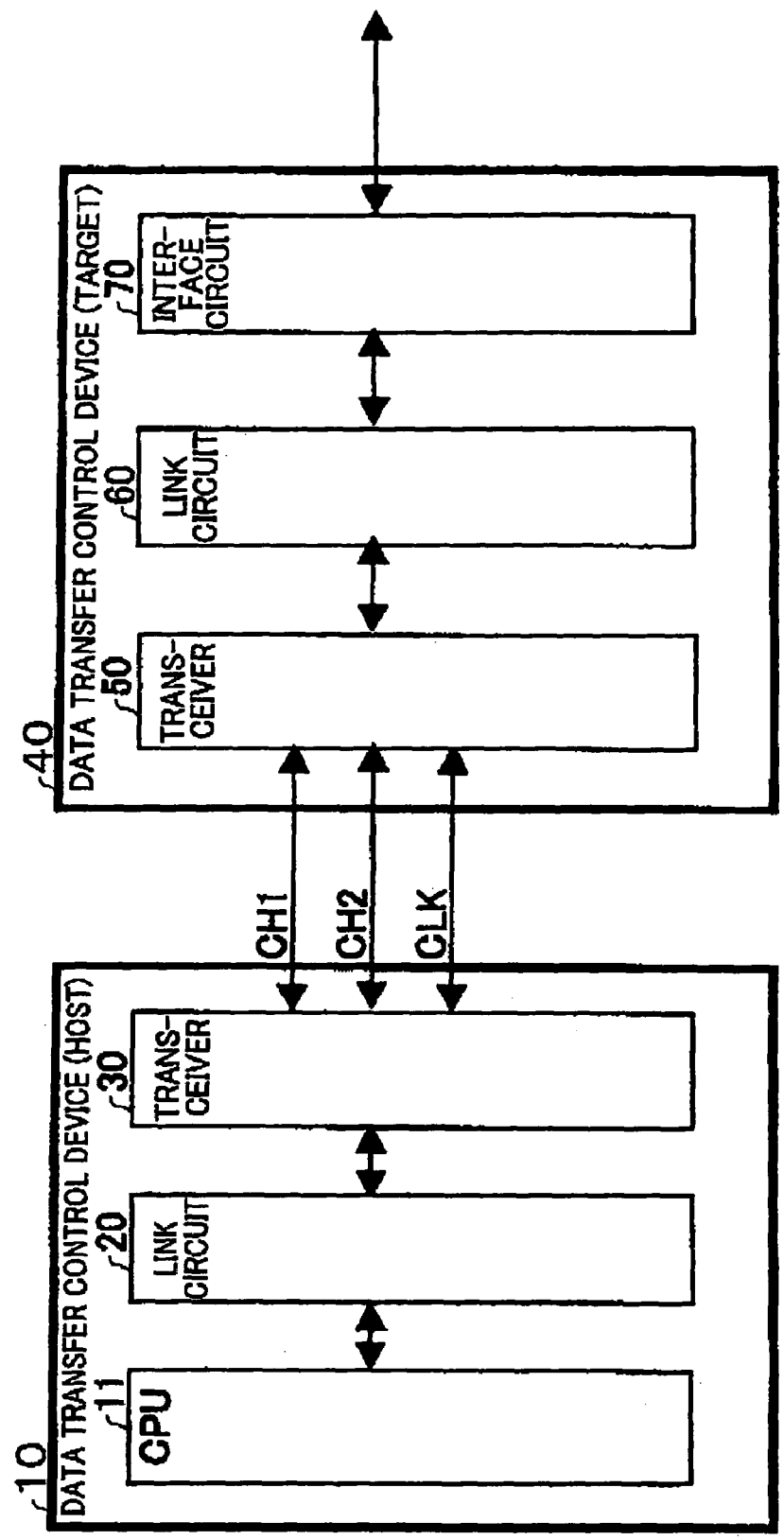
FIG. 1 shows the configuration and connection of a data transfer control device according to one embodiment of the present invention.

The present invention was devised in the light of the above-described technical problems, and may provide a data transfer control device that can implement efficient multi-channel data transfer with small packet types, together with an electronic instrument comprising the same.

According to one embodiment of the present invention, there is provided a data transfer control device which performs data transfer through serial transfer paths for first to pth channels (where p is a natural number greater than one), the data transfer control device comprising:

a node to which is input data to be transferred through the serial transfer paths;

a logic circuit which splits the input data into the first to pth channels in predetermined units in sequence, and outputs the thus-split data and a split transfer notification for each of the first to pth channels;

first to pth parallel/serial conversion circuits which convert the data and the split transfer notification that are output for the first to pth channels into serial signals; and first to pth output circuits which output the serial signals that have been input from the first to pth parallel/serial conversion circuits to the serial transfer paths for the first to pth channels.

In this embodiment, since the data transfer control device outputs the split data and a split transfer notification code to a serial transfer path for each channel, a reception device can detect a split transfer notification code at an early stage, preventing failure during the data recombination stage.

In this data transfer control device, the data transfer control device may perform data transfer through the serial data paths for the first to pth channels and data transfer through a serial transfer path for one channel;

the data transfer control device may further comprise a setting storage device;

when information indicating split transfer is set in the setting storage device and data transfer is performed through the serial transfer paths for the first to pth channels, the logic circuit may split the input data into the first to pth channels in predetermined units in sequence and output the thus-split data and the split transfer notification to each of the first to pth channels;

when information indicating one channel transfer is set in the setting storage device and data transfer is performed through the serial transfer path for one channel, the logic circuit may output the input data to that one channel.

Since this makes it possible to set and store an indication as to whether or not this is a split transfer, the split transfer or one-channel transfer state can be maintained without inputting an instruction, provided there is no change in the split transfer state.

The data transfer control device may further comprise an encoder circuit which receives the split data and the split transfer notification from the logic circuit, converts the split data from m-bit data to n-bit data, converts the split transfer notification from q-bit data to n-bit data (where m, n, and q are natural numbers greater than one, and m<n and q<n), to output the converted split data and split transfer notification to the parallel/serial conversion circuit.

Since this makes it possible for the data transfer control device to use the same number of bits n for expanding both the data and the split transfer notification code, encoding can be done without duplication of the data and the split transfer notification code, so that the processing can proceed as planned once the receiving side has detected a special code that has been defined therein as a split transfer notification code or the like. In addition, the data transfer control device can make the numbers of appearances of 1 and 0 substantially uniform to ensure that the polarity of the expanded codes is balanced, and adjust the timing of the data sampling by reducing the number of continuous appearances. Since the data transfer control device expands the codes, it can detect errors by using the presence of null codes that should not have been transferred, and detect errors such as running disparity under the 8B10B standard.

In this data transfer control device, the encoder circuit may convert the split data from 8-bit data to 10-bit data in conformance with the 8B10B standard, and convert the split transfer notification into 10-bit data by performing conversion into a special code regulated by the 8B10B standard.

This enables the data transfer control device to use an encoder conforming to the 8B10B standard.

In this data transfer control device, when quantities of the split data for the first to pth channels are different, the logic circuit may insert a code that adjusts phase of data to be transferred next, into a channel with less data among the first to pth channels.

Since this enables data transmission such that a code that adjusts phase is inserted into a channel with a smaller data quantity, a receiver device can correctly combine data that has been received from a plurality of channels.

According to one embodiment of the present invention, there is provided a data transfer control device for performing data transfer through serial transfer paths for first to pth channels (where p is a natural number greater than one), the data transfer control device comprising:

first to pth receiver circuits which receives data from the serial transfer paths for the first to pth channels;

first to pth serial/parallel conversion circuits which converts serial signals that have been output from the first to pth receiver circuits into parallel signals;

a split transfer notification code detection circuit which detects whether a split transfer notification code is included in a signal output from the serial/parallel conversion circuits; and a logic circuit which outputs data that has been received from the serial transfer paths for the first to pth channels, in predetermined units in sequence, when the split transfer notification code detection circuit has detected the split transfer notification code.

In this embodiment, the data transfer control device can distribute data that is received together with the split transfer notification code sequentially over the channels. The data transfer control device can therefore return data to its original form after it has been split by the transmitter sequentially into a plurality of channels.

In this data transfer control device, the logic circuit may divide a signal from the first to pth serial/parallel conversion circuits into signal portions to be stored in first to pth storage areas in a signal means, and output the signal portions from the first to pth storage areas in predetermined units in sequence.

The data transfer control device may further comprise a decoder circuit which receives a signal from the first to pth serial/parallel conversion circuits, wherein, when the received signal is a special code, the decoder circuit may output the special code or a signal converted from the special code to the split transfer notification code detection circuit; and wherein, when the received signal is data, the decoder circuit may decode the data from n-bit data into m-bit data (where m and n are natural numbers greater than one, and m<n), and output the decoded data to the storage means.

Since this enables the data transfer control device to use data that has been expanded during the data transfer over the serial transfer paths, the encoding can be done without duplication of the data and the split notification code, so that the processing can proceed as planned once the receiving side has detected a special code that has been defined therein as a split transfer notification code or the like. In addition, the numbers of appearances of 1 and 0 can be made substantially uniform to ensure that the polarity of the expanded codes is balanced, and adjust the timing of data sampling by reducing the number of continuous appearances. Since the data transfer control device expands the codes, it can detect errors by using the presence of null codes that should not have been transferred, and detect errors such as running disparity under the 8B10B standard.

In this data transfer control device, the decoder circuit may decode data from 10 bits to 8 bits, in conformance with the 8B10B standard, and input the split transfer notification code as a special code as regulated by the 8B10B standard.

This enables the data transfer control device to use a decoder conforming to the 8B10B standard.

According to one embodiment of the present invention, there is provided an electronic instrument comprising any of the above-described data transfer control devices.

The electronic instrument can input and output serial data through multiple channels, efficiently and with small-scale circuitry.

These embodiments will be described below in detail. Note that the embodiments described below do not in any way limit the scope of the invention laid out in the claims herein. In addition, not all of the elements of the embodiments described below should be taken as essential requirements of the present invention.

1. Data Transfer Control Device

A data transfer control device (or a bus bridge device or an interface device) according to one embodiment of the present invention is shown in FIG. 1. Note that the data transfer control device of this embodiment is not limited to the configuration shown in FIG. 1. For example, the configuration of the data transfer control device could be such that some of the circuit blocks of FIG. 1 can be omitted, the connective states between circuit blocks can be modified, or circuit blocks that are different from those shown in FIG. 1 can be added. Similarly, the configuration could be such that more channels than CH1 and CH2 could be provided, each channel is unidirectional from a host, or an interface circuit 70 of a data transfer control device 40 on the target side is omitted. In addition, an interface circuit could be provided in the data transfer control device 10 on the host side, or a plurality of each of a LINK circuit 20 and a transceiver 30 could be provided, by way of example. In this embodiment, the host side supplies a clock and the target side uses the thus-supplied clock as a system clock for operation.

The data transfer control devices 10 and 40 transfer data by serial transfer though a plurality of channels CH1 and CH2 formed from a serial bus. More specifically, the data transfer control devices 10 and 40 transfer data by implementing current driving (or voltage driving) in differential signal lines of the serial bus.

The data transfer control device 10 on the host side comprises the LINK circuit 20 (link-layer circuitry) that performs link-layer processing. The LINK circuit 20 generates packets (write request packets and read request packets) to be transmitted to the data transfer control device 40 that is connected thereto by the serial bus. The LINK circuit 20 then instructs the transceiver 30 to transmit the thus-generated request packets. In other words, the LINK circuit 20 activates and executes a transmission transaction. For a transfer that is divided between a plurality of channels (hereinafter called a multi-channel split transfer or split transfer), the LINK circuit 20 instructs the transceiver 30 to transfer for each of the plurality of channels.

The data transfer control device 10 on the host side comprises the transceiver 30 (physical-layer circuitry) that performs physical-layer processing. The transceiver 30 performs processing to transmit the request packet that it was instructed to transmit by the LINK circuit 20, to the data transfer control device 40 that is connected thereto by the serial bus. For multi-channel split transfer, the transceiver 30 transmits to the data transfer control device 40 through a plurality of serial buses.

Note that the transceiver 30 also performs reception processing for request packets from the data transfer control device 40 on the target side. In such a case, a LINK circuit 60 analyzes each request packet that is received, and performs link-layer (transaction-layer) processing.

The data transfer control device 40 on the target side comprises a transceiver 50 (physical-layer circuitry) that performs physical-layer processing. The transceiver 50 performs reception processing for request packets from the data transfer control device 10 (generally speaking: the partner device) that is connected thereto by the serial bus. Note that the transceiver 50 performs transmission processing for request packets to the data transfer control device 10. In such a case, the LINK circuit 60 generates the request packets to be transmitted and instructs the transceiver 50 to transmit the thus-generated request packets.

The data transfer control device 40 on the target side comprises the LINK circuit 60 (link-layer circuitry) that performs link-layer processing. The LINK circuit 60 analyzes each request packet received by the transceiver 50, and performs link-layer (transaction-layer).

The data transfer control device 40 on the target side comprises the interface circuit 70. The interface circuit 70 is a circuit for performing data transfer over a bus (parallel bus) that differs from the serial bus. This bus could be a bus that implements an RGB interface (generally speaking: a stream interface) or a bus that implements an MPU interface (generally speaking: a command/data interface), as will be described later. The provision of the interface circuit 70 makes it possible for the transceiver 30 to have a bus bridge function.

Note that the configuration and operation of the embodiment below relates to a case in which the data transfer control device 10 on the host side transmits a request packet to the data transfer control device 40 on the target side, in order to simplify the description, but the configuration and operation is similar when the data transfer control device 40 on the target side transmits a request packet to the data transfer control device 10 on the host side.

2. Host LINK Circuit

Figure 2:
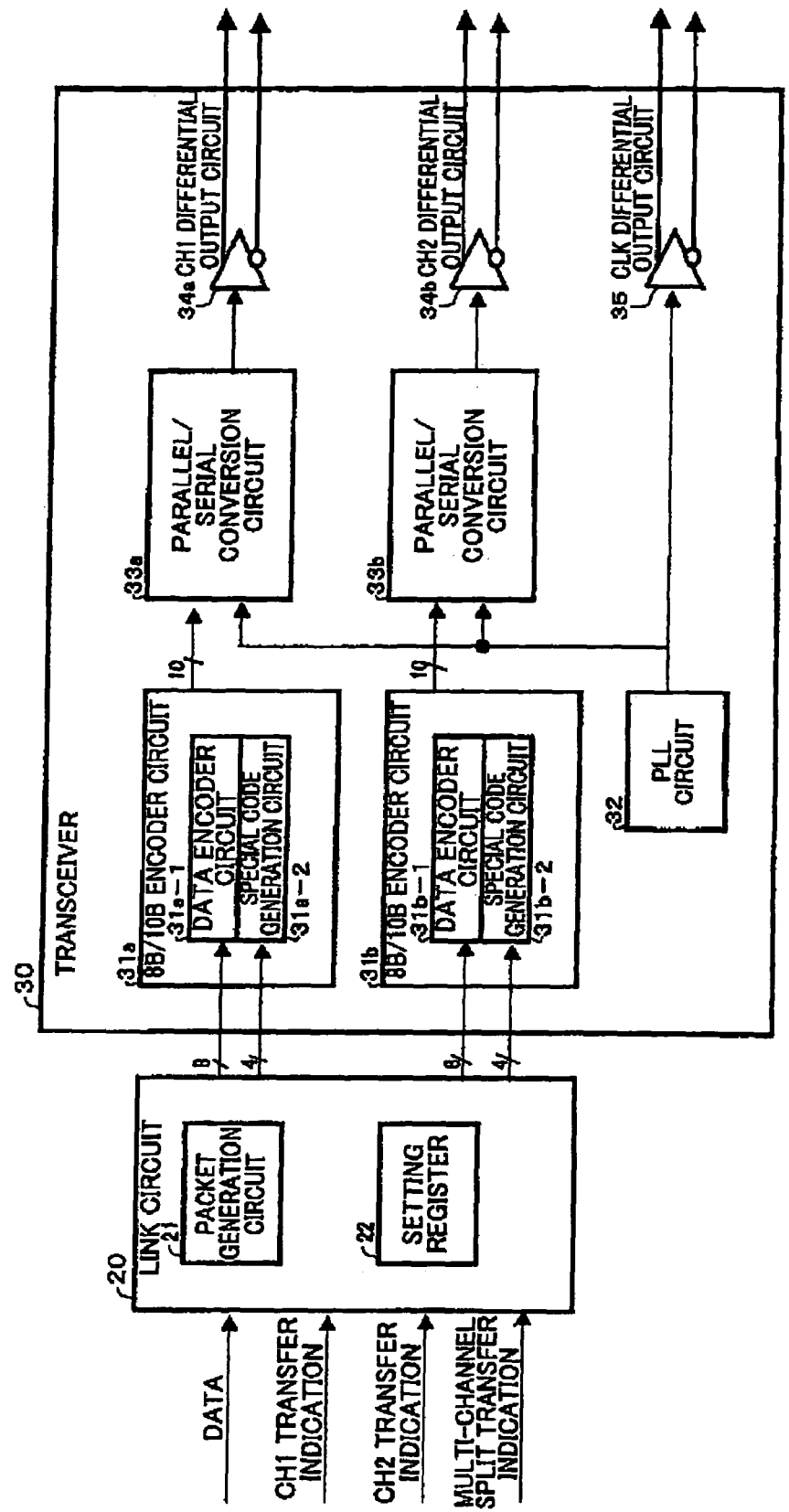
FIG. 2 shows the configuration of a data transfer control device (host) according to one embodiment of the present invention.

The LINK circuit 20 on the host side is shown in FIG. 2. Note that the configuration of the LINK circuit 20 of this embodiment is not limited to that shown in FIG. 2 and thus some of the circuit blocks of FIG. 2 can be omitted, the connective states between circuit blocks can be modified, or circuit blocks that are different from those shown in FIG. 2 can be added.

In FIG. 2, a packet generation circuit 21 comprised within the LINK circuit 20 is a circuit that generates packets to be transferred from the serial bus for the plurality of channels CH1 and CH2. The packet generation circuit 21 generates a packet consisting of a data area and a control area, based on data that has been input from a CPU 11, information that is stored in a setting register 22, and an instruction from the CPU 11. Note that the packets will be described in detail later.

The setting register (generally speaking: a storage device) 22 comprised within the LINK circuit 20 stores setting information for the data transfer control device 10. More specifically, the setting information is information such as whether each of the channels CH1 and CH2 is active or inactive, whether or not multi-channel split transfer is being performed, setting information for setting details such as the time for timing out on the serial bus, and setting information for the LINK circuit terminals. In addition, a status register could also be provided for storing pointer (position) information indicating start and end addresses in a FIFO (generally speaking: a storage device, not shown in the figures) or status information for the data transfer control device.

A CH1 transfer instruction, a CH2 transfer instruction, and a multi-channel split transfer instruction are input to the LINK circuit 20 from the CPU 11, and the setting register 22 is set to indicate that CH1 and CH2 are active and split transfer is being done. If split transfer is set in the setting register 22, the LINK circuit 20 outputs the split transfer notification to the transceiver 30. This split transfer notification is input to special code generation circuits 31a-2 and 31b-2 as parallel 4-bit signals, by way of example.

When data is next input, the packet generation circuit 21 generates a packet. The LINK circuit 20 splits the thus-generated packet between the plurality of channels CH1 and CH2 for input to the transceiver 30. Alternatively, the packet generation circuit 21 generates packets in a state in which they are split between the plurality of channels CH1 and CH2, and inputs them to the transceiver 30. The thus-split packet is input to data encoder circuits 31a-1 and 31b-1 as parallel 8-bit signals, by way of example.

3. Host Transceiver

The transceiver 30 on the host side is shown in FIG. 2. Note that the configuration of the transceiver 30 of this embodiment is not limited to that shown in FIG. 2, and thus some of the circuit blocks of FIG. 2 can be omitted, the connective state between circuit blocks can be modified, and different circuit blocks can be added.

In FIG. 2, an 8B/10B encoder circuit 31a provided for the transceiver 30 comprises the data encoder circuit (data expansion circuit) 31a-1 and the special code generation circuit 31a-2. Similarly, a 8B/10B encoder circuit 31b provided for the transceiver 30 comprises the data encoder circuit (data expansion circuit) 31b-1 and the special code generation circuit 31b-2.

Data to be output for channel 1, out of the split packets, is input to the data encoder circuit 31a-1, data conversion is done to expand the bit width thereof, and the result is output. The data encoder circuit 31a-1 converts the 8-bit wide input codes into 10-bit wide output codes, by way of example. In this case, the configuration could be such that two or more types of code can be prepared for one input code, such as positive and negative codes, with the configuration being such that the data encoder circuit 31a-1 outputs the positive and negative codes alternately. The provision of two or more output codes in this manner makes it possible to determine that there is a reception error if the data transfer control device 40 on the reception side does not receive positive and negative codes alternately from the serial signal line for channel 1, by way of example. A data encoder circuit 31b-1 converts data for channel 2 in a similar manner. The data conversion could also be converted in accordance with the 8B10B standard.

The special code generation circuit 31a-2 generates special codes such as a split transfer notification code, preamble code, a start code, or an abort code, and transmits them to a parallel/serial conversion circuit 33a. In this case, the special codes could be configured to be output at the same bit width as the output of the data encoder circuit 31a-1. In addition, two or more types of code could be prepared as special codes having the same meaning, such as positive and negative codes, with the configuration being such that these positive and negative codes are output alternately. The special codes could also be special 10-bit codes conforming to the 8B10B standard. The 8B/10B encoder circuit 31a could also be con-figured to output to the parallel/serial conversion circuit 33a together with the output of the data encoder circuit 31a-1 and the output of the special code generation circuit 31a-2. The thus-output codes could also be configured to alternate between positive and negative. The special code generation circuit 31b-2 generates special codes for channel 2 in a similar manner to the special code generation circuit 31a-2.

In FIG. 2, a PLL circuit (generally speaking: a clock supply circuit) 32 supplies a divided clock to the parallel/serial conversion circuits 33a and 33b and a clock differential output circuit (generally speaking: a clock output circuit). In this case, the divided clock is a clock that is divided from a reference clock supplied to the 8B/10B encoder circuits 31a and 31b. If a divided clock that is one-tenth of the reference clock is supplied to the parallel/serial conversion circuits 33a and 33b, by way of example, the parallel/serial conversion circuits 33a and 33b converts parallel data of a 10-bit width that is input thereto at the reference clock into serial data at each conversion, enabling output to the data transfer control device 40 through output circuits 34a and 34b. By outputting the divided clock to the data transfer control device 40 through a CLK differential output circuit 35, the transceiver 30 can also enable the data transfer control device 40 to use the divided clock as a sampling clock for serial data that is input from the serial lines for each of channel 1 and channel 2.

In FIG. 2, the parallel/serial conversion circuit 33a provided for the transceiver 30 converts the parallel data for channel 1, which is input from the 8B/10B encoder circuit 31a, into serial data and outputs it to the output circuit 34a. The parallel/serial conversion circuit 33b converts the data for channel 2 into serial data for output to the output circuit 34b, in a similar manner to the parallel/serial conversion circuit 33a.

4. Target Transceiver

Figure 3:
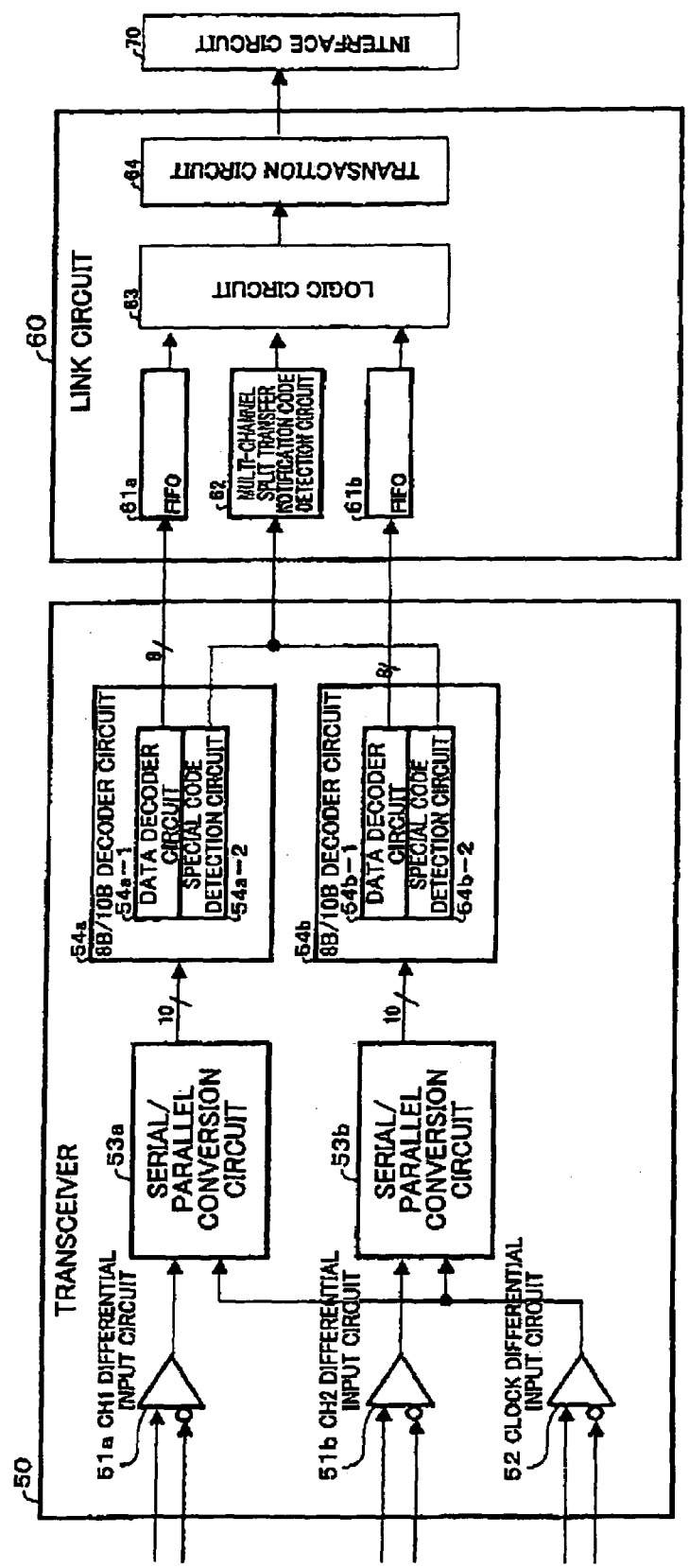
FIG. 3 shows the configuration of a data transfer control device (target) according to one embodiment of the present invention.

The transceiver 50 on the target side is shown in FIG. 3. Note that the configuration of the transceiver 50 of this embodiment is not limited to that shown in FIG. 3, and thus some of the circuit blocks of FIG. 3 can be omitted or provided in the LINK circuit 60, the connective states between circuit blocks can be modified, or different circuit blocks can be added.

The transceiver 50 of the target comprises input circuits (generally speaking: a CH1 differential input circuit 51a and a CH2 differential input circuit 51b), a clock input circuit (generally speaking: a clock differential input circuit 52), serial/parallel conversion circuits 53a and 53b, and 8B/10B decoder circuits 54a and 54b, as shown in FIG. 3. Data received as channel 1 is converted by the CH1 differential input circuit 51a from differential signals into a single-line signal that is input to the serial/parallel conversion circuit 53a.

A clock is converted from a differential clock to a single-line clock by the clock differential input circuit 52, and is input to the serial/parallel conversion circuit 53a. The configuration could also be such that the clock is supplied to each operating block as an operating clock for the target. Similarly, the configuration could be such that the clock is supplied at a frequency suited to the supply destination.

The serial/parallel conversion circuit 53a inputs the clock as a sampling clock, and converts the serial signal that is input from the CH1 differential input circuit 51a into a parallel signal (of a 10-bit width, by way of example) and outputs it. The parallel signal that the serial/parallel conversion circuit 53a outputs is input to an 8B/10B decoder circuit 54a, a special code is detected in a special code detection circuit

54*a*-2, and a signal corresponding to that special code is output from the transceiver 50. The codes that are not the special code within the parallel signal that the serial/parallel conversion circuit 53*a* outputs are decoded by a data decoder circuit 54*a*-1. This decoding could be converted and returned by the data encoder circuit 31*a*-1 of the host.

The serial/parallel conversion circuit 53*b*, a data decoder circuit 54*b*-1, and a special code detection circuit 54*b*-2 perform similar signal processing for channel 2. Note that the configuration of the transceiver 50 is not limited to that shown in FIG. 3, and thus part of this configuration can be omitted or included within the LINK circuit 60. For example, if the input is a single-line signal input not a differential input, the configuration can be such that the differential input circuits 51*a* and 51*b* and the clock differential input circuit 52 are omitted. Similarly, the sampling clock could be generated by the target and the clock differential input circuit 52 can be omitted.

5. Target LINK Circuit

The LINK circuit 60 on the target side comprises storage devices (FIFOs 61*a* and 61*b*, but these are not limited to FIFOs and could be other means such as RAM); a multi-channel split transfer notification code detection circuit 62; a logic circuit 63 that analyzes packets, separates the header data of packets, and combines channels; and a transaction circuit 64, as shown in FIG. 3. Note that the configuration of the LINK circuit 60 of this embodiment is not limited to that shown in FIG. 3, and thus some of the circuit blocks of FIG. 3 can be omitted or provided in the LINK circuit 60, the connective states between circuit blocks can be modified, or circuit blocks that are different from those shown in FIG. 3 can be added. For example, the configuration could be such that the storage devices (the FIFOs 61*a* and 61*b*) are provided outside of the LINK circuit 60 and the LINK circuit 60 accesses those storage devices.

In the LINK circuit 60 shown in FIG. 3, parallel data that has been input from the transceiver 50 as channel 1 data is input to the FIFO 61*a*. Similarly, parallel data that has been input from the transceiver 50 as channel 2 data is input to the FIFO 61*b*. A signal corresponding to the special code detected by the special code detection circuits 54*a*-2 and 54*b*-2 of the transceiver is input to the multi-channel split transfer notification code detection circuit 62.

Once the multi-channel split transfer notification code detection circuit 62 has detected that the signal corresponding to the special code is a split transfer notification code, it outputs a split transfer notification signal to the logic circuit 63. When the logic circuit 63 has input the split transfer notification signal, it reads out data alternately from the FIFO 61*a* and FIFO 61*b* to combine (regenerate) the packet that has been split between channel 1 and channel 2 for transfer. The packet is transferred as split between channel 1 and channel 2. In contrast thereto, since the split transfer notification code is transferred in both channel 1 and channel 2 (such as CH1 and CH2 in FIG. 5A and CH1 and CH2 in FIG. 5B), if there should be a delay in the transfer of one channel, the logic circuit 63 can detect the split transfer notification code from the other channel and wait for the split packet from the delayed channel to combine (regenerate) the packet. In this embodiment, the FIFOs 61*a* and 61*b* have sufficient capacity to store 25 nanoseconds of data transferred from channel 1 and channel 2, respectively, but increasing the storage capacity of the FIFOs 61*a* and 61*b* would make it possible to combine the packet even when the delay between channels is greater than 25 nanoseconds. With this embodiment, the operating clock of the LINK circuit 60 is 40 MHz and the storage capacity of the FIFOs 61*a* and 61*b* is set to the 25 nanoseconds for one clock period.

The transaction circuit 64 performs processing to output the combined packet to the interface circuit 70 in the next stage.

6. Signal Processing Flow

Figure 4:
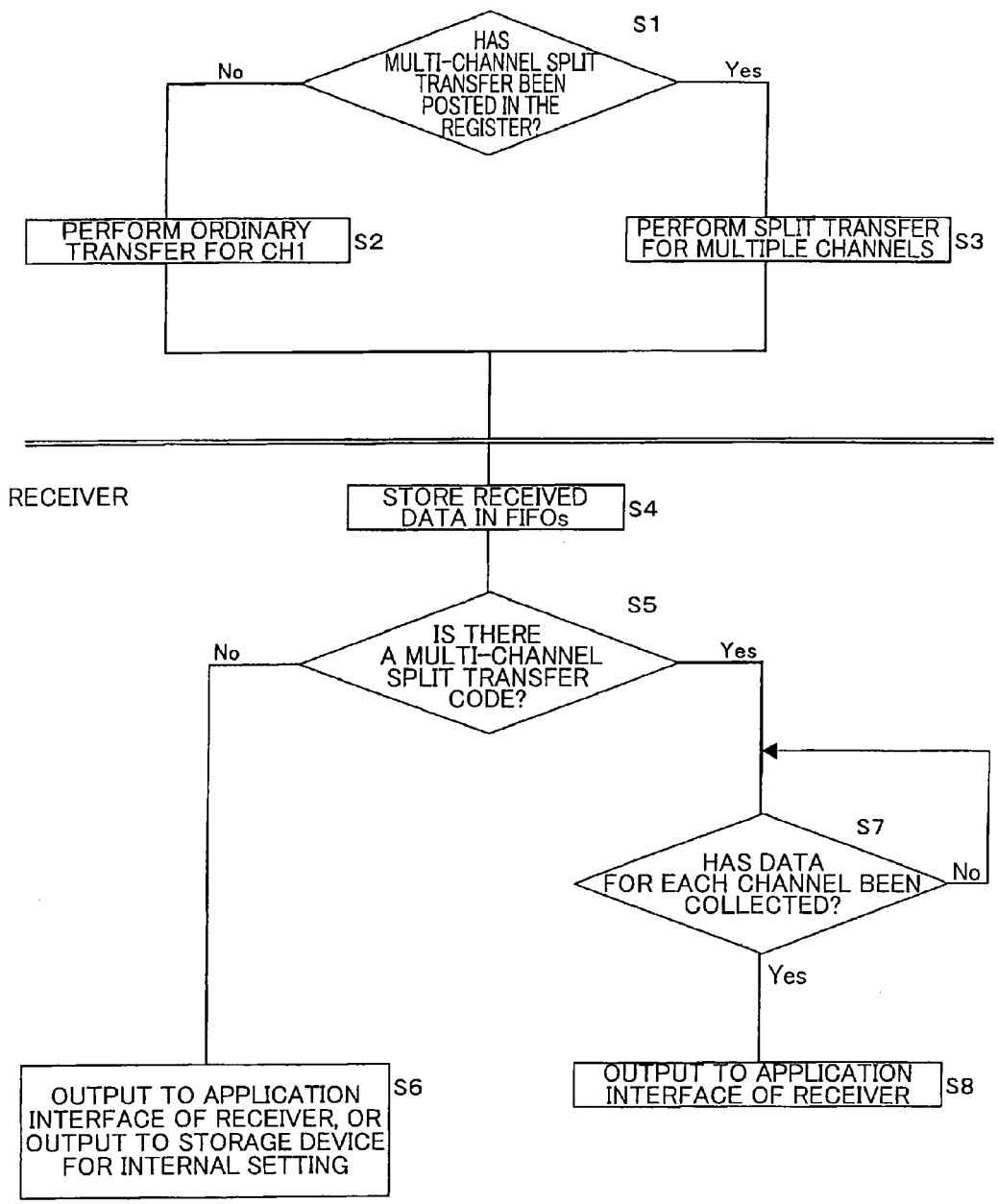
FIG. 4 is a flowchart of signal processing according to one embodiment of the present invention.
Figure 6A:
FIGS. 6A and 6B show the signal configuration by a conventional art.
Figure 6B:
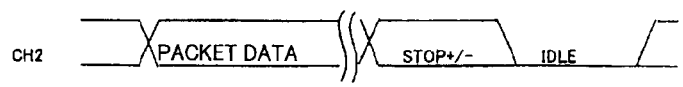
Figure 6C:
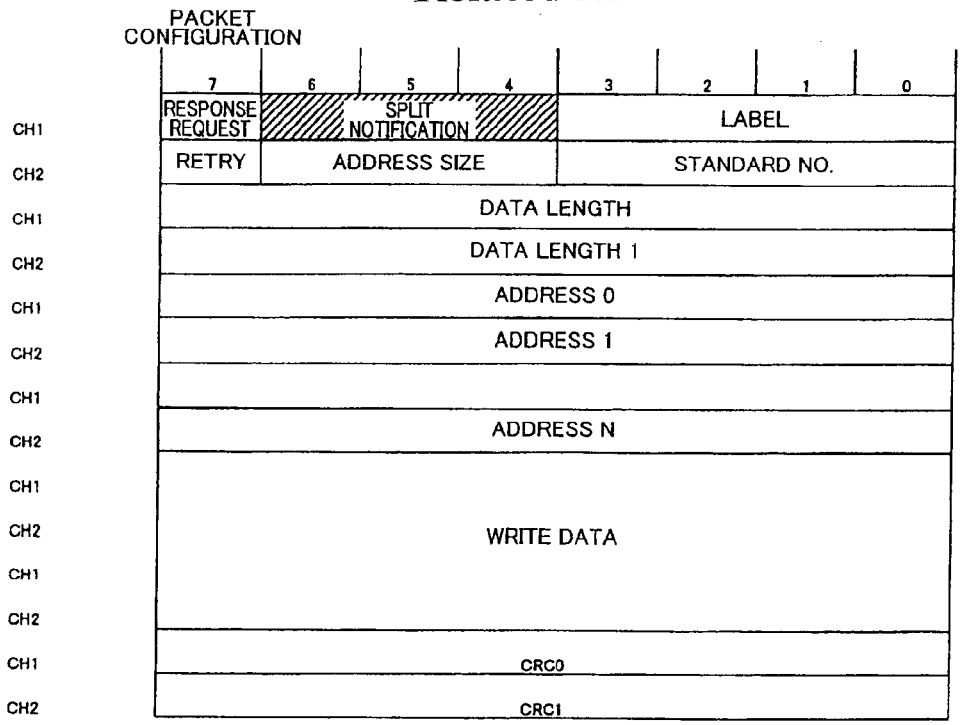
FIG. 6C shows the packet configuration by a conventional art.

In the signal processing flow for the transmitter shown in FIG. 4, if the fact that this is a multi-channel split transfer is posted to the setting register 22 (step S1), the data is split and transferred through the plurality of channels (step S3). If the setting of the setting register 22 is that this is not a multi-channel split transfer, or if the setting is that it is a one-channel transfer, data from one channel (such as CH1) is transferred (step S2).

In the signal processing flow for the receiver shown in FIG. 4, the data received from each channel is stored in the FIFOs 61*a* and 61*b* (step S4). The receiver determines whether or not the received signals comprise a multi-channel split transfer notification code (step S5), and, if there is a multi-channel split transfer notification code, it stores the packet in each of the FIFOs 61*a* and 61*b*, and stores the split packet until a time that enables the channel combination (regeneration) of the packet (step S7). After the receiver has stored data in the FIFOs 61*a* and 61*b* until the packet can be combined, the pre-split packet can be output by alternately outputting data from CH1 and CH2. The receiver outputs the pre-split packet that has been regenerated by the combination to the interface circuit 70 (step S8). If there is no multi-channel split transfer notification code in the signal at step S5, a packet from one channel is output to the interface circuit 70 or it is output to a storage device for internal setting (step S6).

7. Signal and Packet Configurations

The signal and packet configurations when transfer is split between a plurality of channels are shown in FIGS. 5A, 5B, and 5C. FIG. 5A shows the signal configuration for split transfer between channel 1 (CH1) and channel 2 (CH2). A preamble PLE is a signal for adjusting the data sampling timing of the parallel/serial conversion circuit 33*a* and is transferred for each channel. The split transfer notification code is a code indicating that the transfer is split between a plurality of channels. Since the split transfer notification code is inserted into each channel, the LINK circuit 60 can detect this code and combine the packet even when there is a delay in the transfer from one channel. The packet data is a split packet. More specifically, the packet data is configured as shown in FIG. 5C, and is split and transferred alternately to channel 1 and channel 2 at predetermined timing. Note that the units of the split is 1 byte or 8 bits, but the configuration could equally well be such that the transfer between the host and the target through the serial interface is in 10-bit units expanded from 8 bits. The host notifies the target that the transmission for each channel of the split packet has ended by inserting a stop code STOP into each channel.

FIG. 5B shows the configuration of the signals when real-time characteristics are more important than in FIG. 5A. These signals are used in burst transfer. The signals of FIG. 5B differ from those of FIG. 5A in that dummy codes are inserted therein. If the split packet of channel 1 is larger than the split packet of channel 2, the host can adjust the number of bytes transferred by inserting dummy codes into channel 2. Since the received dummy codes cause the special code detection circuits 54*a*-2 and 54*b*-2 to identify the packet, the target can remove the dummy codes to assemble the packet. This ensures that the interface circuit 70 in the later stage does not receive the dummy codes. Note that the host can combine the packet that comprises the split packets from the delayed channel during an idle period (IDLE) after the packet transfer of FIG. 5A or after the stop code STOP.

8. Electronic Instrument

The circuitry of FIGS. 2 and 3 can be inserted into an electronic instrument. The CPU 11 on the host side can be made to function as the application processor of a mobile phone, connected to the interface circuit 70 and components such as a liquid-crystal driver on the target side. The configuration could also be such that the serial signal lines CH1 and CH2 and the clock signal line CLK are wired through a hinge portion or a rotational portion of a hinged or rotational type of mobile phone. This reduces the number of wires required in comparison with a case in which a parallel interface is used, making the hinge portion or the rotational portion more compact and helping increase the operating range thereof. This enables data transfer at a transfer rate that is higher than that for one channel. The configuration could also be such that a baseband engine or camera is connected to the interface circuit 70 of the target side.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention. Note that any term cited with a different term having broader or the same meaning at least once in this specification or drawings can be replaced by the different term in any place in this specification and drawings.

What is claimed is:

1. A data transfer control device comprising:
   a node to which input data is received, the input data being transferred through serial transfer paths for first to pth channels, wherein p is a natural number greater than one;
   a logic circuit that splits the input data into predetermined units for the first to pth channels in sequence, and outputs thus-split data together with a split transfer notification code for each of the first to pth channels when split data transfer is performed, and outputs the input data without the split transfer notification code to one of the first to pth channels when the single data transfer is performed;
   first to pth parallel/serial conversion circuits that convert the data and the split transfer notification code that are outputted for the first to pth channels into serial signals; and
   first to pth output circuits that output the serial signals that have been inputted from the first to pth parallel/serial conversion circuits to the serial transfer paths for the first to pth channels.

2. The data transfer control device as defined in claim 1, the data transfer control device further comprising:
   a setting storage device,
   when the split data transfer is performed, information indicating the split data transfer being set in the setting storage device, and the logic circuit splits the input data into predetermined units for the first to pth channels in sequence and outputs the thus-split data and the split transfer notification code to each of the first to pth channels, and
   when the single data transfer is performed, information indicating the single data transfer is set in the setting storage device, and the logic circuit outputs the input data to one of the first to pth channels.

3. The data transfer control device as defined in claim 1, further comprising:
   an encoder circuit that receives the thus-split data and the split transfer notification code from the logic circuit, converts the thus-split data from m-bit data to n-bit data, converts the split transfer notification from q-bit data to n-bit data, wherein m, n, and q are natural numbers greater than one, and m<n and q<n, to output the converted split data and the split transfer notification code to the parallel/serial conversion circuit.

4. The data transfer control device as defined in claim 3, the encoder circuit converting the thus-split data from 8-bit data to 10-bit data, and converts the split transfer notification code into 10-bit data by performing conversion into a special code.

5. The data transfer control device as defined in claim 1, when quantities of the split data for the first to pth channels are different, the logic circuit inserting a code that adjusts phase of data to be transferred next, into a channel with less data among the first to pth channels.

6. A data transfer control device comprising:
   first to pth receiver circuits that receives data from serial transfer paths for first to pth channels, wherein p is a natural number greater than one, in which split data transfer serial transfer paths for first to pth channels and single data transfer through one of the serial transfer paths are performed and outputs the data as serial signals;
   first to pth serial/parallel conversion circuits that converts the data outputted from the first to pth receiver from the serial signals to parallel signals;
   a split transfer notification code detection circuit that detects whether or not a split transfer notification code is included in the data from the serial/parallel conversion circuits; and
   a logic circuit that outputs the data in predetermined units in sequence when the split transfer notification code detection circuit has detected the split transfer notification code, and outputs data without the split transfer notification code when the split transfer notification code detection circuit has not detected the split transfer notification code.

7. The data transfer control device as defined in claim 6, the logic circuit dividing a signal from the first to pth serial/parallel conversion circuits into signal portions to be stored in first to pth storage areas in a signal means, and outputting the signal portions from the first to pth storage areas in predetermined units in sequence.

8. The data transfer control device as defined in claim 7, further comprising:
   a decoder circuit that receives a signal from the first to pth serial/parallel conversion circuits,
   when the received signal is a special code, the decoder circuit outputting the special code or a signal converted from the special code to the split transfer notification code detection circuits, and
   when the received signal is data, the decoder circuit decoding the data from n-bit data into m-bit data, wherein m and n are natural numbers greater than one, and m<n, and outputting the decoded data to the storage means.

9. The data transfer control device as defined in claim 8, the decoder circuit decoding data from 10 bits to 8 bits, and inputting the split transfer notification code as a special code.

10. An electronic instrument comprising the data transfer control device as defined in claim 1.

11. An electronic instrument comprising the data transfer control device as defined in claim 6.

* * * * *